United States Patent [11] 3,624,540

[72] Inventor Didier Leonard
Boulogne, France
[21] Appl. No. 887,232
[22] Filed Dec. 22, 1969
[45] Patented Nov. 30, 1971
[73] Assignee C. I. T. Compagnie Industrielle Des Telecommunications
Paris, France
[32] Priority Dec. 20, 1968
[33] France
[31] 179756

[54] FREQUENCY SYNTHESIZER

6 Claims, 1 Drawing Fig.

[52] U.S. Cl. .......... 331/38, 331/40, 331/161
[51] Int. Cl. .......... H03b 21/02
[50] Field of Search .......... 331/38, 40, 161, 39; 325/18, 20

[56] References Cited

UNITED STATES PATENTS

| | | | |
|---|---|---|---|
| 2,401,481 | 6/1946 | Harnett | 331/40 |
| 2,487,857 | 11/1949 | Davis | 331/40 |
| 3,085,202 | 4/1963 | Jakubowics | 331/39 |

*Primary Examiner*—John Kominski
*Attorney*—Craig, Antonelli and Hill

ABSTRACT: The simplified synthesizer supplying pairs of frequencies spaced at regular intervals comprises three oscillators, 24-quartz crystals, two modulators, but only 20-AND gates instead of the 30 previously required.

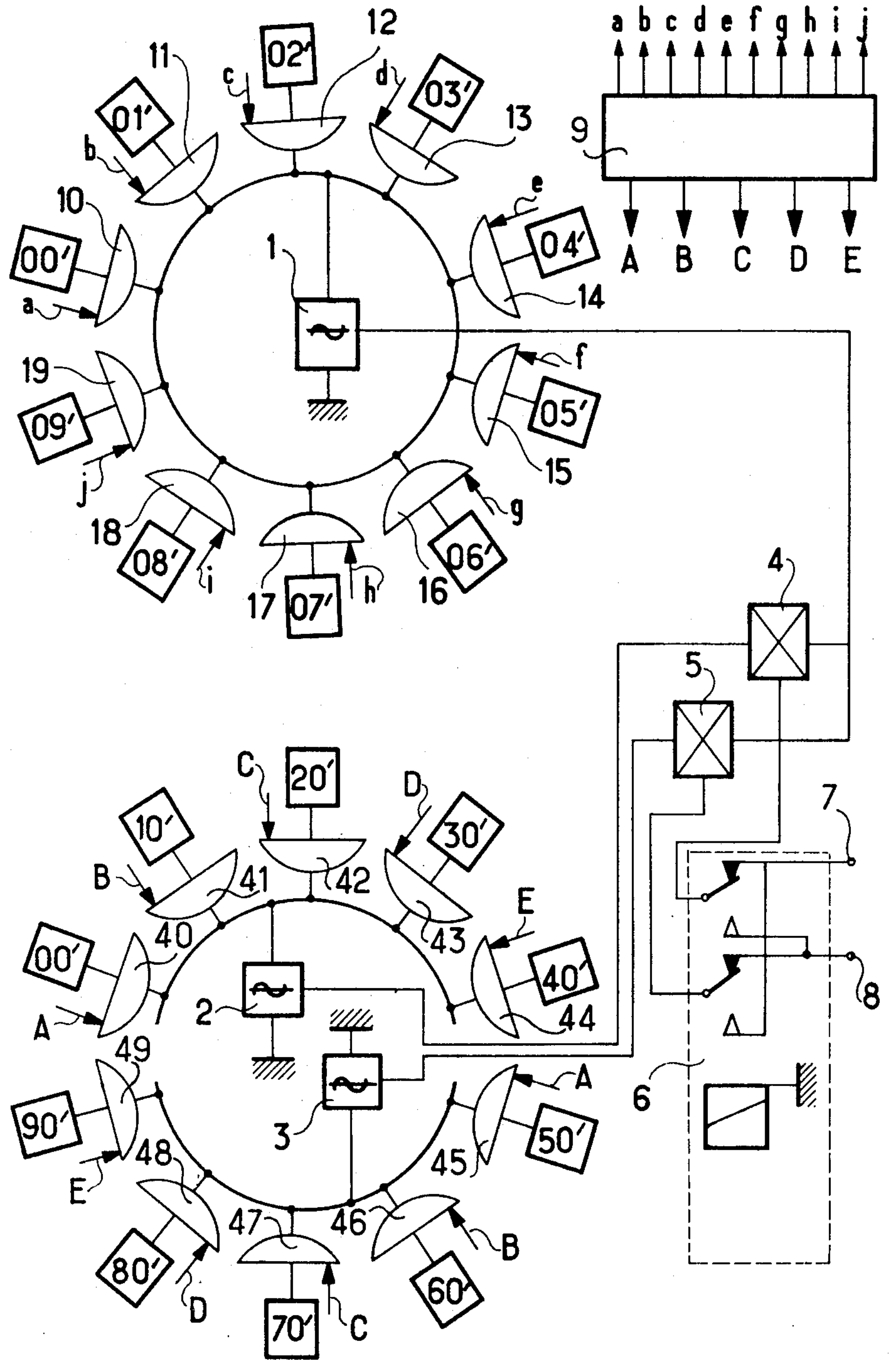
a b c d e f g h i j
9
A B C D E
1
2
3
4
5
6
7
8
00' 01' 02' 03' 04' 05' 06' 07' 08' 09'
10 11 12 13 14 15 16 17 18 19
00' 10' 20' 30' 40' 50' 60' 70' 80' 90'
40 41 42 43 44 45 46 47 48 49

FREQUENCY SYNTHESIZER

The invention relates to a frequency synthesizer and is more specifically concerned with a modification of the invention disclosed in my copending application Ser. No. 771,008, filed Oct. 28, 1968, and assigned to the same assignee as the present application.

The above-referenced copending application describes and claims a frequency synthesizer having a range of frequency positions at each of which a unique frequency is delivered and provided with a switching arrangement operable to select simultaneously any pair of frequencies spaced from one another by a constant number of frequency positions, the synthesizer including: a lower order oscillator selectively connectable to a first set of quartz to provide a lower order frequency determined by the quartz crystals to which the oscillator is connected; two higher order oscillators simultaneously connectable to respective positions in a second set of quartz crystals to provide respective higher order frequencies determined by the two selected quartz crystals which are always spaced from one another by a constant number of frequency positions in the second set; first and second modulators receiving respectively the selected higher order frequencies and both receiving the selected lower order frequency, the two modulators providing respective output frequencies spaced by a constant amount in the range of frequency positions; and a logic circuit controlling the selection of the quartz crystal determining the output frequencies of the three oscillators in accordance with a logic input signal significant of the output frequency pair to be delivered.

The above-referenced copending application describes a frequency synthesizer capable of supplying a pair of frequencies selected from among 50 pairs, according to the position of a selector switch.

One position of the selector switch taken from among 10 possible positions, has the effect of selecting a frequency pair by associating a "unit" crystal with a "units" oscillator, a first "10"crystal with a "10's receiving" oscillator and a second "10" crystal with a "10's sending" oscillator. The "unit" crystal is selected by a "units" output of the selector switch, the two "10" crystals are selected by a "10's" output of the selector switch.

A first or receiving modulator, combines the frequency of the "units" oscillator with the frequency of the "10'5 receiving" oscillator, and supplies at the output the given receiving frequency. A second or sending modulator, combines this frequency of the "units" oscillator with the frequency of the "10's sending" oscillator and supplies at the output the given sending frequency.

Each of the 100 frequencies is identified by a numerical code, and the "units" and "10's" selected by the selector switch are those of the corresponding code. It should be noted that there need not be a direct relation between a frequency and its code.

The synthesizer is so arranged that the selected sending and receiving frequencies have codes whose difference is 50, for example 28, 78.

However, choosing one receiving frequency from among the 100 possible frequencies and one associated sending frequency from among the 100 possible frequencies involves a certain redundancy and no advantage is lost in predetermining for each of the 50 frequencies intended for receiving one of the 50 frequencies intended for transmission: on the contrary, this arrangement is advantageous, as it enables twice as rapid scanning. Since a sending frequency is automatically determined as soon as a receiving frequency is known, it is sufficient to carry out scanning (for example to find a free channel) on 50 frequencies and not on 100. The halving of scanning time represents a distinct advantage.

In accordance with the invention there is provided a frequency synthesizer having a range of positions at each of which a unique frequency pair is delivered, the synthesizer including: a lower order oscillator selectively connectable to a first set of quartz crystals to provide a lower order frequency determined by the crystal to which the oscillator is connected; a first higher order oscillator selectively connectable to a second set of quartz crystals to provide a first higher order frequency determined by the crystal to which the oscillator is connected; a second higher order oscillator selectively connectable to a third set of quartz crystals to provide a second higher order frequency determined by the crystal to which the oscillator is connected; a first summation element for combining the lower order frequency and the first higher order frequency to provide a first output frequency; a second summation element for combining the lower order frequency and the second higher order frequency to provide a second output frequency; and control circuitry adapted to control the selective connection of the first and second higher order oscillators to the second and third sets of quartz crystals so that for each selected first higher order frequency, there is always selected a particular second higher order frequency, whereby selection of a particular first or second output frequency is automatically accompanied by selection of a particular second or first output frequency forming a unique frequency pair.

The invention relates particularly to transmitting-receiving stations for radio telephonic connections between two subscribers selected from a large number. Under these conditions, the invention operates according to one of two methods: for the calling subscriber, during a call, the handset is unhooked, and the channels coded one to 50 (for example) are devoted to receiving, and the channels 51 to 100 are devoted to transmitting. The situation is the reverse with a called subscriber whose handset has not been unhooked at the start of the call: the channels one to 50 are transmission channels, and the channels 51 to 100 are receiving channels. An inverter for sensing whether the handset is in place or unhooked must be added.

The invention will now be described in more detail by way of example and with reference to the accompanying drawing, in which the single FIGURE shows a block schematic diagram of a synthesizer.

In the FIGURE, the lower order or "units" oscillator bears the reference 1: it can be connected to a "unit" quartz crystal selected from among a first set of 10 crystals 00′ to 09′ by a gate selected from among 10 gates 10 to 19, respectively.

The oscillator 2 is a first higher order or "10's" oscillator; it can be connected to a 10 quartz crystal selected from among a second set of five crystals 00′ to 40′ by a gate selected from among five gates 40 to 44, respectively. The oscillator 3 is a second higher order of "10'5" oscillator, it can be connected to a "10" quartz crystal selected from a third group of five crystals 50′ to 90′ by a gate selected from among five gates 45 to 49, respectively.

The selection of the gates is effected by a selector switch 9, which has 10 "units" outputs *a*, *b*. . . . *i*, *j* and five "10's" outputs A, B, . . . E. Each output a . . . *j* is connected to an input of a respective one of the gates 10 . . . 19.

The outputs A. . . E are connected to both first control terminals of the respective pairs of gates 40 and 45, 41 and 46, 42 and 47, 43 and 48, and 44 and 49, respectively.

The outputs of the oscillators 1 and 2 are combined in a summation element 4 including a modulator and filter. The outputs of the oscillators 1 and 3 are combined in a summation element 5 containing a modulator and filter.

The output of the element 4 provides a selected one of 50 frequencies coded one to 50, and that of the element 5 a selected one of 50 frequencies coded 51 to 100. The codes of the two frequencies selected at any one time differ by 50.

The output frequencies of the elements 4, 5 are applied to respective inputs of a relay 6. The lower of the two frequencies is applied either to output terminal 7 or to output terminal 8, depending on the state of the relay. The higher frequency is applied to the other output terminal. In a transmitter-receiver station, for example, the relay state depends on whether the station is making or awaiting a call, terminal 7 supplying the reception frequency and terminal 8 the transmission frequency.

The synthesizer has been described, by way of example, for 50 pairs of frequencies, but the invention is applicable to any even number of frequencies.

If the synthesizer is associated with a frequency scanning device, it can be seen that full scanning covers half the total frequency band, rather than the total band as in the aforementioned copending application. In a particular example, the individual frequencies are spaced at intervals of 50 kc./s. A first group of 50 frequencies covers 2,500 kc./s. between 60 mc./s. and 62.5 mc./s. A second group of 50 frequencies covers 2,500 kc./s. between 72.5 mc./s. and 75 mc./s. The intergroup gap, required for duplex communication, is thus 10 mc./s.

Although the present invention has been described with reference to but a single embodiment, it is to be understood that the scope of the invention is not limited to the specific details thereof, but is susceptible of numerous changes and modifications as would be apparent to one with normal skill in the pertinent technology.

What we claim is:

1. A frequency synthesizer having a range of positions at each of which a unique frequency pair is delivered, comprising:

a lower order oscillator selectively connectable to a first set of quartz crystals to provide a lower order frequency determined by the crystals to which the oscillator is connected;

a first higher order oscillator selectively connectable to a second set of quartz crystals to provide a first higher order frequency determined by the crystal to which the oscillator is connected;

a second higher order oscillator selectively connectable to a third set of quartz crystals to provide a second higher order frequency determined by the crystal to which the oscillator is connected;

first summation means for combining said lower order frequency and said first higher order frequency to provide a first output frequency;

second summation means for combining said lower order frequency and said second higher order frequency to provide a second output frequency; and control circuit means for controlling the selective connection of the first and second higher order oscillators to the second and third sets of quartz crystals in coordination with each selected first higher order frequency, so that there is always selected a particular second higher order frequency, whereby selection of a particular first or second output frequency is automatically accompanied by selection of a particular second or first output frequency forming a unique frequency pair.

2. A synthesizer as claimed in claim 1, in which each oscillator is selectively connectable to respective ones of the associated set of quartz crystals by a respective switching element.

3. A synthesizer as claimed in claim 2, in which the number of unique frequency pairs is N, and in which the switching element of the lower order oscillator contains two-N gates, the switching elements of said first and second higher order oscillators each contain N gates arranged in pairs, a first control terminal of each gate of each pair being connected to that of the other gate of the pair.

4. A synthesizer as claimed in claim 1, including a relay connected to receive said first and second output frequencies and adapted to selectively apply the first output frequency to a first or second output terminal and the second output frequency to the remaining output terminal.

5. A synthesizer as claimed in claim 1, wherein said control circuit means includes selector switch means for connecting corresponding quartz crystals in the respective sets of quartz crystals to each of said oscillators.

6. A synthesizer as claimed in claim 1, wherein said first and second summation means each include a modulator and filter arrangement.

* * * * *